United States Patent [19]

Shima et al.

[11] 4,332,008
[45] May 25, 1982

[54] MICROPROCESSOR APPARATUS AND METHOD

[75] Inventors: Masatoshi Shima, Santa Clara; Federico Faggin, Cupertino; Ralph K. Ungermann, Los Altos, all of Calif.

[73] Assignee: Zilog, Inc., Cupertino, Calif.

[21] Appl. No.: 92,827

[22] Filed: Nov. 9, 1979

Related U.S. Application Data

[62] Division of Ser. No. 665,228, Mar. 9, 1976, abandoned.

[51] Int. Cl.³ .................... G06F 9/00; G06F 13/00
[52] U.S. Cl. .................................. 364/200; 365/222
[58] Field of Search ... 364/200 MS File, 900 MS File, 364/222

[56] References Cited

U.S. PATENT DOCUMENTS 3,748,651 7/1973 Mesnik .......................... 365/222
3,760,379 9/1973 Nibby et al. .................. 365/222

Primary Examiner—Joseph M. Thesz
Assistant Examiner—John G. Mills, III
Attorney, Agent, or Firm—Limbach, Limbach & Sutton

[57] ABSTRACT

Microprocessor apparatus in which the CPU generates as an integral function memory refresh addresses for an external dynamic memory without degradation of CPU performance. The CPU architecture is optimized by dividing the CPU devices selectively into groups during different time periods by the use of switching devices in the internal bus structure.

5 Claims, 20 Drawing Figures

CPU BLOCK DIAGRAM

CPU BLOCK DIAGRAM

CPU REGISTER CONFIGURATION

MINIMUM COMPUTER SYSTEM

ROM & RAM IMPLEMENTATION EXAMPLE

BASIC CPU TIMING EXAMPLE

INSTRUCTION OP CODE FETCH

ADDING ONE WAIT STATE TO AN M1 CYCLE

ADDING ONE WAIT STATE TO ANY MEMORY CYCLE

INSTRUCTION OP CODE FETCH WITH WAIT STATES

INTERFACING DYNAMIC RAMS

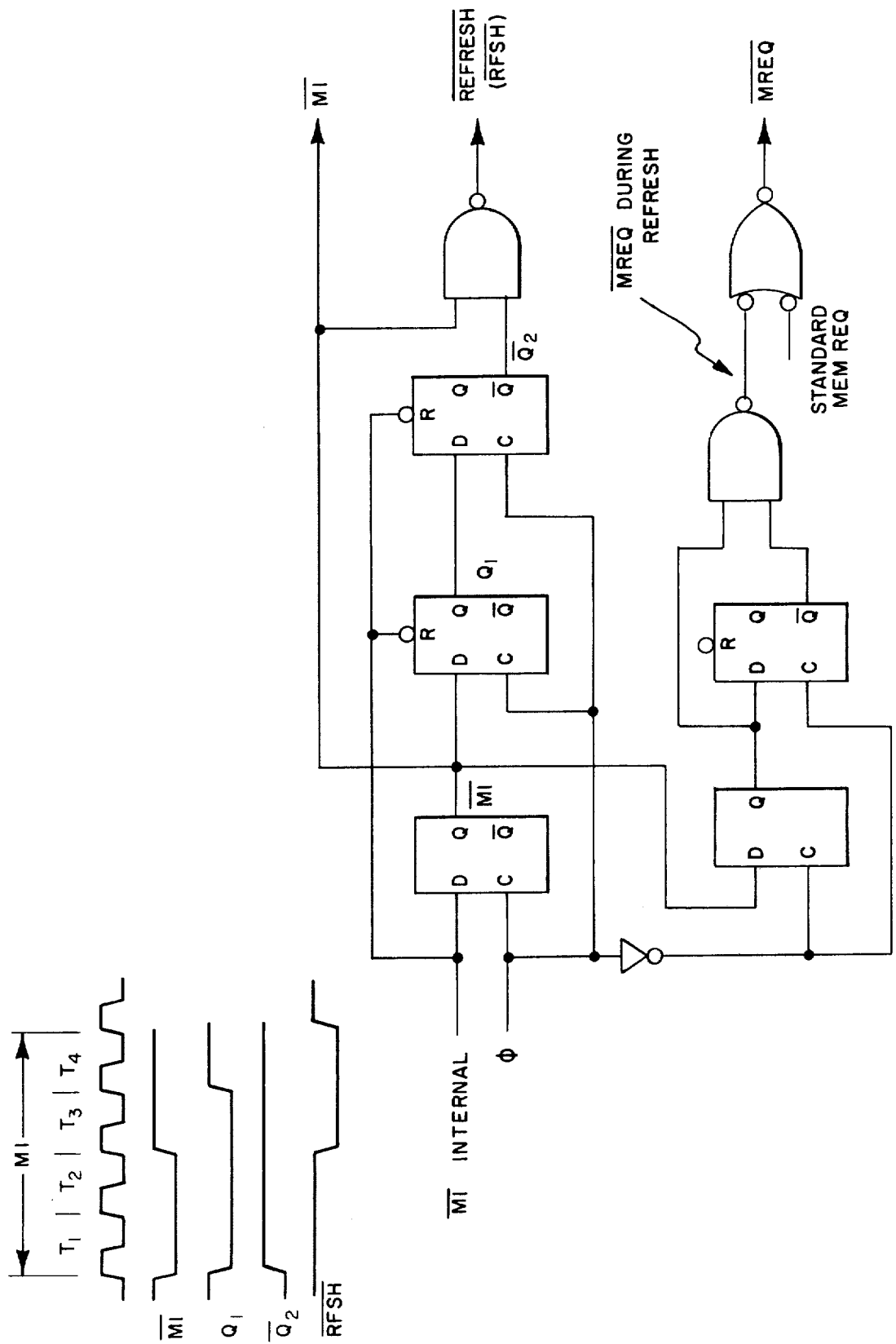
FIG. 9A "REFRESH" GENERATOR LOGIC

FIG. 12 TIME:

| T1 | T2 | T3 | T4 | T5 | T6 | T7 | T8 | T9 | T10 |
|---|---|---|---|---|---|---|---|---|---|
| LOAD PROGRAM COUNTER TO ADDRESS LATCH | STORE RESULT OF INC. TO PROGRAM COUNTER | STORE DATA (INPUT) TO INSTRUCTION REG. | LOAD REFRESH COUNTER TO ADDRESS LATCH | STORE RESULT OF INC TO REFRESH COUNTER | LOAD SELECTED ACC TO TEMP. ACC | LOAD SELECTED FLAG TO TEMP. FLAG | | STORE RESULT OF ALU TO SELECTED | |

FIG. 13 TIME:

| T1 | T2 | T3 | T4 | T5 | T6 |
|---|---|---|---|---|---|
| LOAD PC TO AL | STORE INC. TO PC | LOAD RFC TO AL | STORE INC TO RFC | | |
| STORE ALU TO FLAG 1 OR 2 | STORE DATA (INPUT) TO IR | LOAD ACC 1 OR 2 TO ACCT | LOAD FLAG 1 OR 2 TO FLAGT | LOAD REG. N TO TEMP REG IN ALU | STORE ALU TO ACC 1 OR 2 |

FIG. 16 OPERATION TIME COMPARISON

EXAMPLE  ACC + REG. N → ACC
                      ↓       ↑
                  ONE OF GENERAL PURPOSE REGISTER
                  ONE OF ACCUMULTORS

OPERATIONS ARE:

1. SEND OUT PROGRAM COUNTER AND UPDATE IT.
2. FETCH INSTRUCTION TO INSTRUCTION REG.
3. SEND OUT MEMORY REFRESH COUNTER AND UPDATE.
4. EXECUTE ADDITION.

FIG. 14 TIME

| | T1 | T2 | T3 | T4 |
|---|---|---|---|---|
| | LOAD PC TO AL | STORE INC. TO PC | LOAD RFC TO AL | STORE INC. TO RFC |
| | STORE ALU TO ACC1 OR 2 FLAG1 OR 2 | | SELECT ACC1 OR 2 FLAG1 OR 2 | LOAD REG. N TO TEMP. REG. IN ALU |

SW 1,2,4 OFF

FIG. 15 TIME

| | T1 | T2 | T3 | T4 |
|---|---|---|---|---|
| | LOAD PC TO AL | STORE INC TO PC | LOAD RFC TO AL | STORE INC TO RFC |
| | STORE ALU TO ACC1 OR 2 FLAG1 OR 2 | STORE DATA TO IR LOAD ACC1 OR 2 TO ACCT LOAD FLAG1 OR 2 TO FLAGT | | LOAD REG. N TO TEMP. REG IN ALU |

SW 1,2,4 OFF    SW 1,4 OFF

MICROPROCESSOR APPARATUS AND METHOD

This is a divisional of Application Ser. No. 665,228, filed Mar. 9, 1976.

BACKGROUND OF THE INVENTION

The present invention generally relates to digital processor apparatus and more particularly to digital microprocessor apparatus using MOS (metal-oxide semiconductor) LSI (large scale integration) technology. While the preferred embodiments are described with respect to an MOS LSI microprocessor, it will be understood by those of ordinary skill in the art that the invention is applicable generally to digital processing.

A microprocessor system typically includes a central processor unit (CPU), memory subsystem and input/output subsystem to permit the system to communicate with the outside world.

More detailed descriptions of prior art microprocessors are found in "Microprocessor," *McGraw-Hill Yearbook of Science and Technology* 1974, McGraw-Hill, Inc., New York, 1974, pp. 272-275; "Components: microprocessors galore," *IEEE Spectrum, January,* 1976, pp. 50-56; "Self-contained microcomputers ease system implementation," *IEEE Spectrum, December,* 1974, p. 53; and "Computer Interfacing: Anatomy of a Microcomputer," *Computer Design, February* 1976, pp. 129,130. All of the above citations are hereby incorporated by reference.

SUMMARY OF THE INVENTION

In the first preferred embodiment, refresh memory addresses for an external dynamic memory, which requires periodic refresh addressing to maintain its memory storage, are generated by a CPU as an integral function of the CPU without any degradation of the CPU performance. That is, this additional CPU function is totally transparent. Prior art systems have employed elaborate logic external to the CPU for the purpose of generating refresh memory addresses for dynamic memories.

The various advantages and details of the present invention will be better appreciated as the accompanying detailed description and accompanying drawings are read and understood.

BRIEF DESCRIPTION OF THE DRAWINGS

FIG. 9A is a block diagram and timing diagram showing the generation in the CPU of signals used in FIG. 9.

FIG. 16 is a diagram showing the operation times for particular CPU operation for the CPU arrangements of FIGS. 12-15.

DESCRIPTION OF THE PREFERRED EMBODIMENTS

Figure 1:
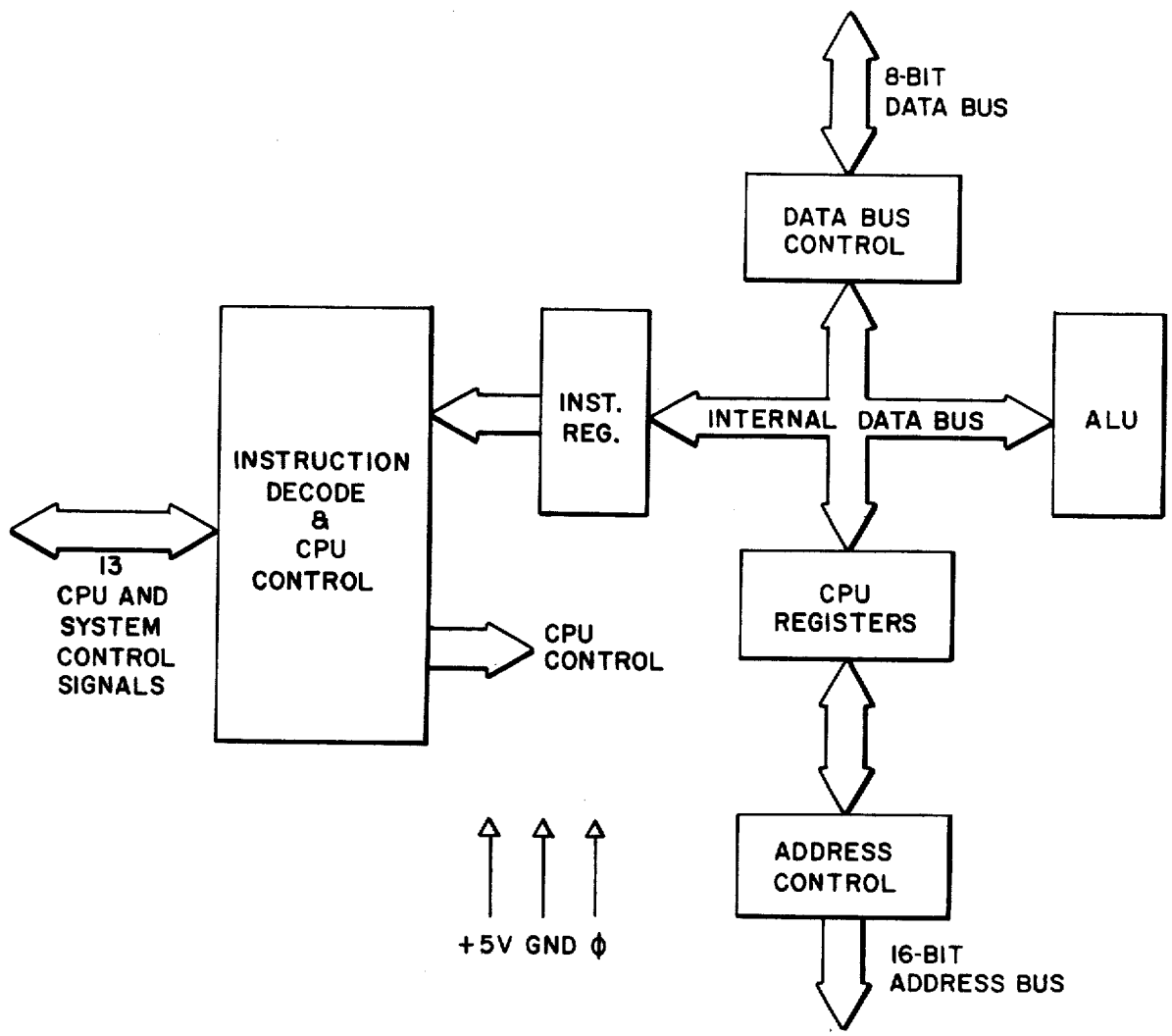
FIG. 1 is a block diagram of a typical central processor unit (CPU) used in digital processing.

A basic element related to the present invention is the central processor unit (CPU), referred to herein occasionally as the "Zilog Z-80 CPU", the designation under which it is to be sold.

The term "microcomputer" has been used to describe virtually every type of small computing device designed within the last few years. This term has been applied to everything from simple "microprogrammed" controllers constructed out of TTL MSI up to low end minicomputers with a portion of the CPU constructed out of TTL LSI "bit slices." However, the major impact of the LSI technology within the last few years has been with MOS LSI. With this technology, it is possible to fabricate complete and very powerful computer systems with only a few MOS LSI components.

The Zilog Z-80 family of components is a significant advancement in the state-of-the art of microcomputers. These components can be configured with any type of standard semiconductor memory to generate computer systems with an extremely wide range of capabilities. For example, as few as two LSI circuits and three standard TTL MSI packages can be combined to form a simple controller. With additional memory and I/O devices a computer can be constructed with capabilities that only a minicomputer could previously deliver. This wide range of computational power allows standard modules to be constructed by a user that can satisfy the requirements of an extremely wide range of applications.

The major reason for MOS LSI domination of the microcomputer market is the low cost of these few LSI components. For example, MOS LSI microcomputers have already replaced TTL logic in such applications as terminal controllers, peripheral device controllers, traffic signal controllers, point of sale terminals, intelligent terminals and test systems. In fact the MOS ISI microcomputer is finding its way into almost every product that now uses electronics and it is even replacing many mechanical systems such as weight scales and automobile controls.

The MOS LSI microcomputer market is already well established and new products using them are being developed at an extraordinary rate. The Zilog Z-80 component set has been designed to fit into this market through the following factors:

1. The Z-80 is fully software compatible with the popular 8080A CPU offered from several sources. Existing designs can be easily converted to include the Z-80 as a superior alternative.
2. The Z-80 component set is superior in both software and hardware capabilities to any other microcomputer system on the market. These capabilities provide the user with significantly lower hardware and software development costs while also allowing him to offer additional features in his system.
3. A complete product line including full software support with strong emphasis on high level languages and a disk-based development system with advanced real-time debug capabilities is offered to enable the user to easily develop new products.

Microcomputer systems are extremely simple to construct using Z-80 components. Any such system consists of three parts:

1. CPU (Central Processing Unit)
2. Memory
3. Interface Circuits to peripheral devices The CPU is the heart of the system. Its function is to obtain instructions from the memory and perform the desired operations. The memory is used to contain instructions and in most cases data that is to be processed. For example, a typical instruction sequence may be to read data from a specific peripheral device, store it in a location in memory, check the parity and write it out to another peripheral device. Note that the Zilog component set includes the CPU and various general purpose I/O device controllers, while a wide range of memory devices may be used from any source. Thus, all required components can be connected together in a very simple manner with virtually no other external logic. The user's effort then becomes primarily one of software development. That is, the user can concentrate on describing his problem and translating it into a series of instructions that can be loaded into the microcomputer memory. Zilog is dedicated to making this step of software generation as simple as possible. A good example of this is our assembly language in which a simple mnemonic is used to represent every instruction that the CPU can perform. This language is self documenting in such a way that from the mnemonic the user can understand exactly what the instruction is doing without constantly checking back to a complex cross listing.

FIG. 1 shows a block diagram of the CPU, showing all of its major elements (digital devices).

CPU REGISTERS

Figure 2:
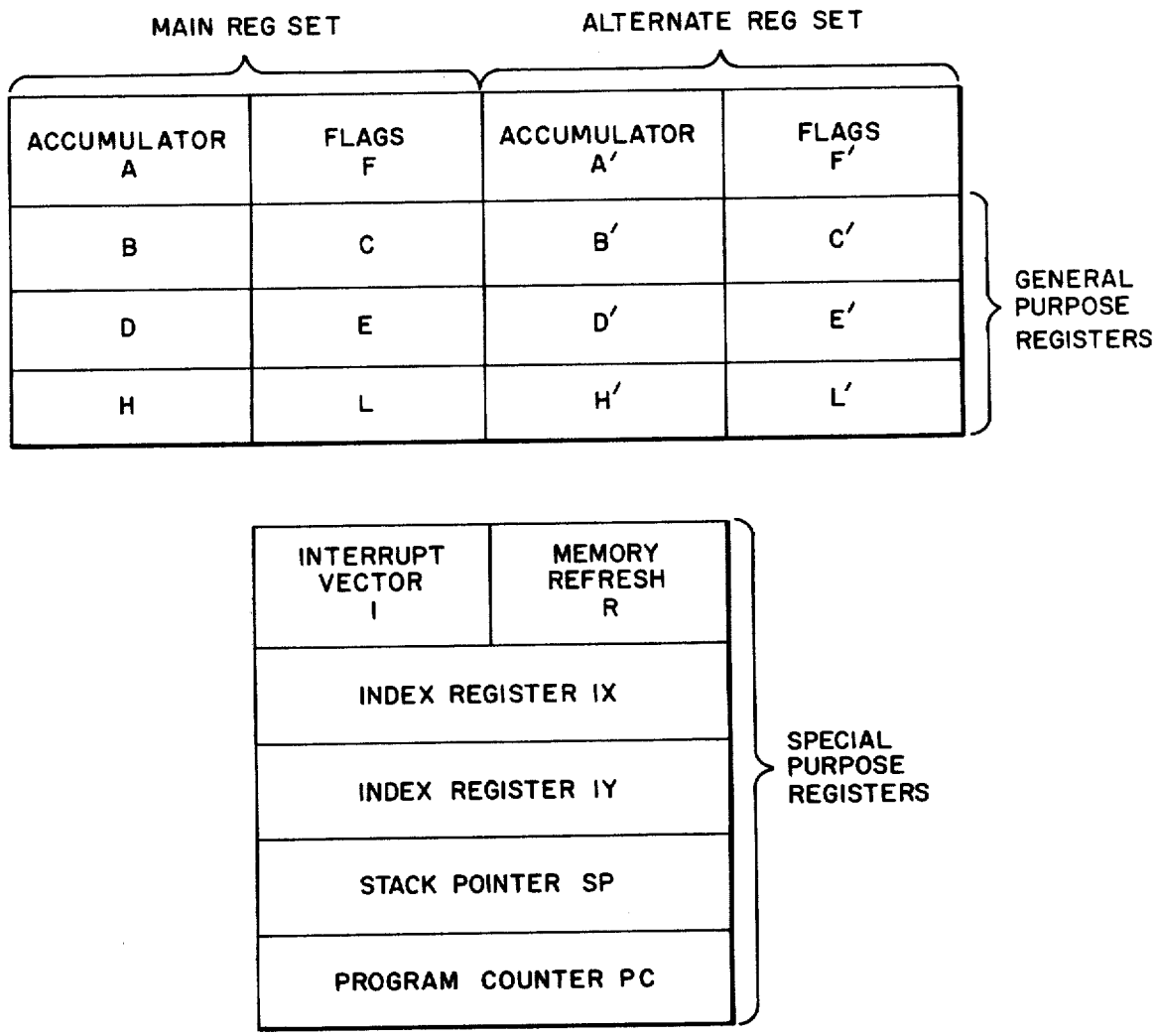
FIG. 2 is an exemplary arrangement of the register configuration of a CPU according to one embodiment of the present invention.

The Z-80 CPU contans 208 bits of R/W memory that are accessible to the programmer. FIG. 2 illustrates how this memory is configured into eighteen 8-bit registers and four 16-bit registers. All Z-80 registers are implemented using static RAM. The registers include two sets of six general purpose registers that may be used individually as 8-bit registers or in pairs as 16-bit registers. There are also two sets of accumulator and flag registers Special Purpose Registers 1. Program Counter (PC). The program counter holds the 16-bit address of the current instruction being fetched from memory. The PC is automatically incremented after its contents have been transferred to the address lines. When a program jump occurs the new value is automatically placed in the PC, overriding the incrementer.

2. Stack Pointer (SP). The stack pointer holds the 16-bit address of the current top of a stack located anywhere in external system RAM memory. The external stack memory is organized as a last-in first-out (LIFO) file. Data can be pushed onto the stack from specific CPU registers or popped off of the stack into specific CPU registers through the execution of PUSH and POP instructions. The data popped from the stack is always the last data pushed onto it. The stack allows simple implementation of multiple level interrupts, unlimited subroutine nesting and simplification of many types of data manipulation.

3. Two Index Registers (IX & IY). The two independent index registers hold a 16-bit base address that is used in indexed addressing modes. In this mode, an index register is used as a base to point to a region in memory from which data is to be stored or retrieved. An additional byte is included in indexed instructions to specify a displacement from this base. This displacement is specified as a two's complement signed integer. This mode of addressing greatly simplifies many types of programs, especially where tables of data are used.

4. Interrupt Page Address Register (I). The Z-80 CPU can be operated in a mode where an indirect call to any memory location can be achieved in response to an interrupt. The I Register is used for this purpose to store the high order 8-bits of the indirect address while the interrupting device provides the lower 8-bits of the address. This feature allows interrupt routines to be dynamically located anywhere in memory with absolute minimal access time to the routine.

5. Memory Refresh Register (R). The Z-80 CPU contains a memory refresh counter to enable dynamic memories to be used with the same ease as static memories. This 7-bit register is automatically incremented after each instruction fetch. The data in the refresh counter is sent out on the lower portion of the address bus along with a refresh control signal while the CPU is decoding and executing the fetched instruction. This mode of refresh is totally transparent to the programmer and does not slow down the CPU operation. The programmer can load the R register for testing purposes, but this register is normally not used by the programmer.

Accumulator and Flag Registers

The CPU includes two independent 8-bit accumulators and associated 8-bit flag registers. The accumulator holds the results of 8-bit arithmetic or logical operations while the flag register indicates specific conditions for 8 or 16-bit operations, such as indicating whether or not the result of an operation is equal to zero. The programmer selects the accumulator and flag pair that he wishes to work with with a single exchange instruction so that he may easily work with either pair.

General Purpose Registers

There are two matched sets of general purpose registers, each set containing six 8-bit registers that may be used individually as 8-bit registers or as 16-bit register pairs by the programmer. One set is called BC.DE and III while the complementary set is called BC'. DE' and III'. At any one time the programmer can select either set of registers to work with through a single exchange command for the entire set. In systems where last interrupt response is required, one set of general purpose registers and an accumulator/flag register may be reserved for handling this very last routine. Only a simple exchange commands need be executed to go between the routines. This greatly reduces interrupt service time by eliminating the requirement for saving and retrieving register contents in the external stack during interrupt or subroutine processing. These general purpose registers are used for a wide range of applications by the programmer. They also simplify programming, especially in ROM based systems where little external read/write memory is available.

ARITHMETIC & LOGIC UNIT (ALU)

The 8-bit arithmetic and logical instructions of the CPU are executed in the ALU. Internally the ALU communicates with the registers and the external data bus on the internal data bus. The type of functions performed by the ALU include:
Add
Left or right shifts or rotates (arithmetic and logical)
Subtract
Increment
Logical AND
Decrement
Logical OR
Set bit
Logical Exclusive OR
Reset bit
Compare
Test bit

INSTRUCTION REGISTER AND CPU CONTROL

As each instruction is fetched from memory, it is placed in the instruction register and decoded. The control sections performs this function and then generates and supplies all of the control signals necessary to read or write data from or to the registers, control the ALU and provide all required external control signals.

Figure 3:
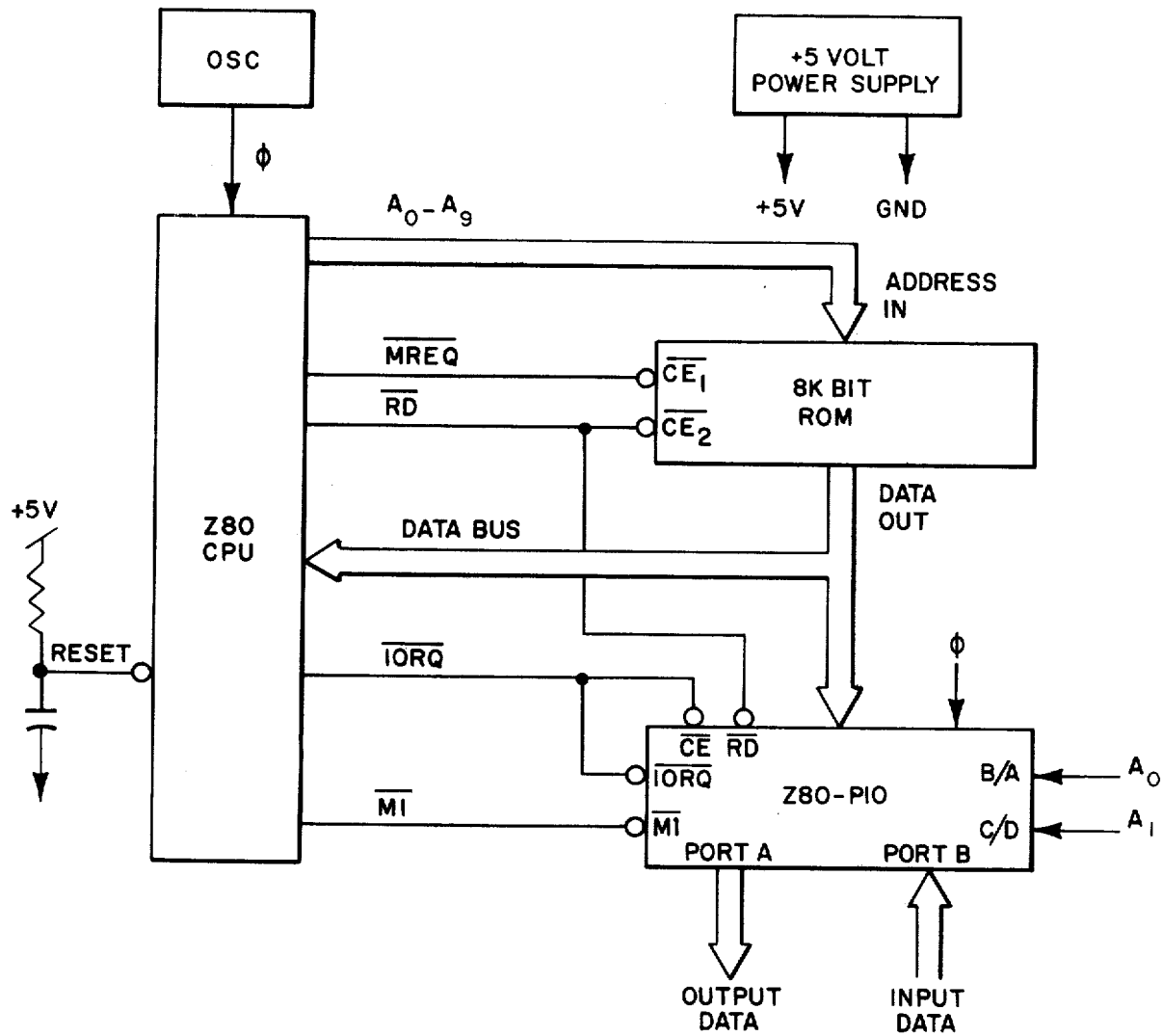
FIG. 3 is an exemplary arrangement of a minimum computer system.

FIG. 3 shows a block diagram of a very simple digital processor system using the CPU. In a practical system the following five elements are required: power supply, oscillator (a source of clock signals), memory devices, I/O circuits, and the CPU.

Since the Z80-CPU only requires a single 5 volt supply, most small systems can be implemented using only this single supply.

The oscillator can be very simple since the only requirement is that it be a 5 volt square wave. For systems not running at full speed, a simple RC oscillator can be used. When the CPU is operated near the highest possible frequency, a crystal oscillator is generally required because the system timing will not tolerate the drift or jitter that an RC network will generate. A crystal oscillator can be made from inverters and a few discrete components or monolithic circuits are widely available.

The external memory can be any mixture of standard RAM, ROM, or PROM. In this simple example we have shown a single 8K bit ROM (1K bytes) being utilized as the entire memory system. For this example we have assumed that the Z-80 internal register configuration contains sufficient Read/Write storage so that external RAM memory is not required.

Every computer system requires I/O circuits to allow it to interface to the "real world." In this simple example it is assumed that the output is an 8-bit control vector and the input is an 8 bit status word. The input data could be gated onto the data bus using any standard tri-state driver while the output data could be latched with any type of standard TTL latch. For this example we have used a Z80-PIO for the I/O circuit. This single circuit attaches to the data bus as shown and provides the required 16 bits of TTL compatible I/O. (Refer to the Z80-PIO manual for details on the operation of this circuit.) Notice in this example that with only three LSI circuits, a simple oscillator and a single 5 volt power supply, a powerful computer has been implemented.

ADDING RAM

Figure 4:
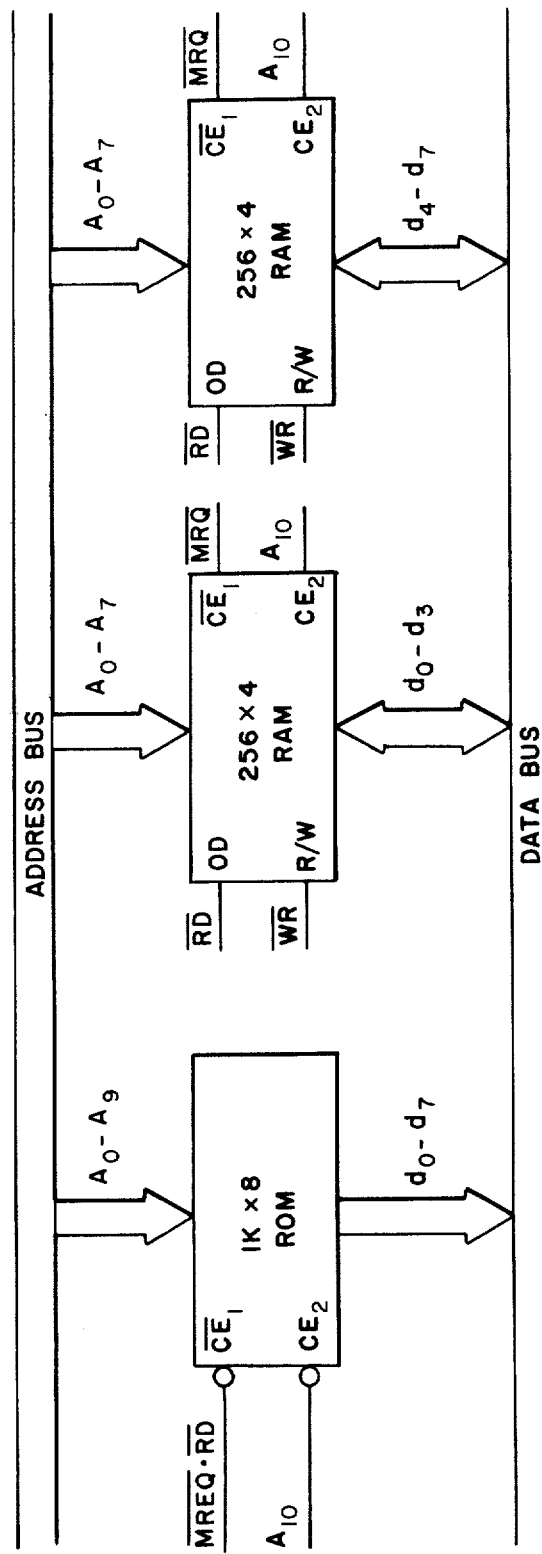
FIG. 4 is an exemplary arrangement of memory blocks forming a portion of a computer system.

Most computer systems require some amount of external Read/Write memory for data storage and to implement a "stack." FIG. 4 illustrates how 256 bytes of static memory can be added to the previous example. In this example the memory space is assumed to be organized as follows:

|  | Address |
|---|---|
| 1K bytes ROM | 0000H |
|  | 03FFH |
| 256 bytes RAM | 0400H |
|  | 04FFH |

In this diagram the address space is described in hexidecimal notation. For this example, address bit $A_{10}$ separates the ROM space from the RAM space so that it can be used for the chip select function. For larger amounts of external ROM or RAM, a simple TTL decoder will be required to form the chip selects.

CPU TIMING

Figure 5:
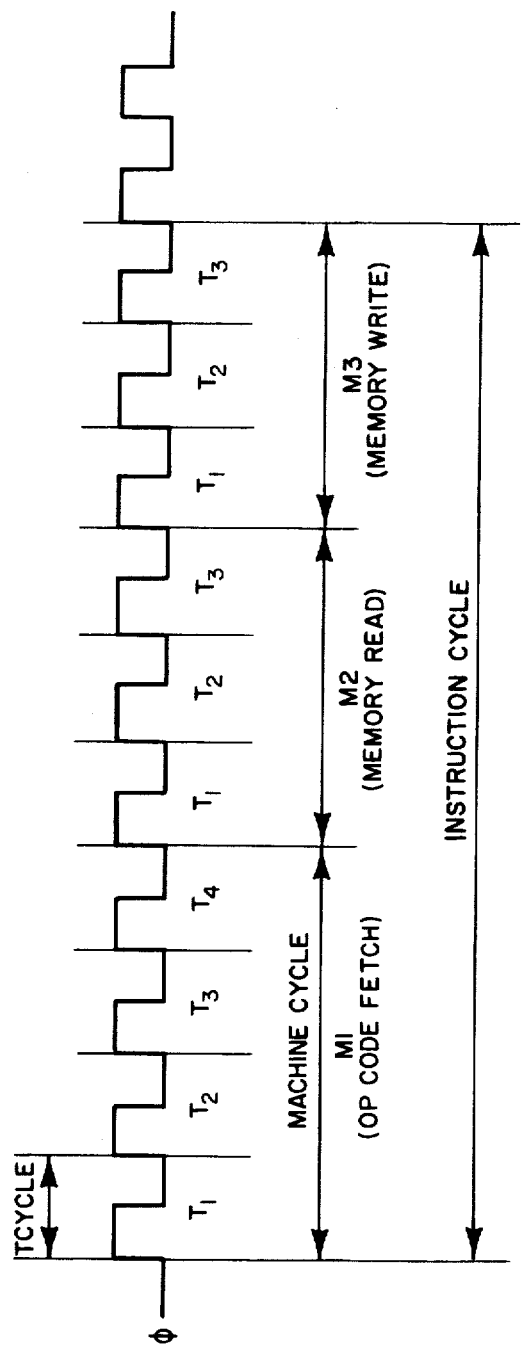
FIG. 5 is an exemplary basic timing diagram of a CPU according to one embodiment of the present invention.

The Z-80 CPU executes instructions by stepping through a very precise set of a few basic operations. These include:
Memory read or write
I/O device read or write
Interrupt acknowledge All instructions are merely a series of these basic operations. Each of these basic operations can take from three to six clock periods to complete or they can be lengthened to synchronize the CPU to the speed of external devices. The basic clock periods are referred to as T cycles and the basic operations are referred to as M (for machine) cycles. FIG. 5 illustrates how a typical instruction will be merely a series of specific M and T cycles. Notice that this instruction consists of three machine cycles (M1, M2 and M3). The first machine cycle of any instruction is a fetch cycle which is four, five or six T cycles long (unless lengthened by the wait signal which will be fully described in the next section). The fetch cycle (M1) is used to fetch the OP code of the next instruction to be executed. Subsequent machine cycles move data between the CPU and memory or I/O devices and they may have anywhere from three to five T cycles (again they may be lengthened by wait states to synchronize the external devices to the CPU). The following paragraphs describe the timing which occurs within any of the basic machine cycles. In section 10, the exact timing for each instruction is specified.

Dynamic RAM's (random access memories) require a periodic "refreshing" of their memory contents to prevent loss of memory. This is accomplished by addressing the rows of the dynamic RAM while enabling the RAM. Prior art processing systems have typically employed elaborate logic external to the CPU to refresh dynamic RAM's. According to the present invention, the refresh signals are generated within the CPU. However, the generation is "totally transparent" and does not affect the CPU speed. The refresh signals are generated during a timing cycle in which the CPU address output is not otherwise in use. Such a suitable time occurs after the CPU fetches an instruction from a memory and is processing the instruction. The dynamic RAM memory addresses for refresh are incremented after each refresh time.

INSTRUCTION FETCH

Figure 6:
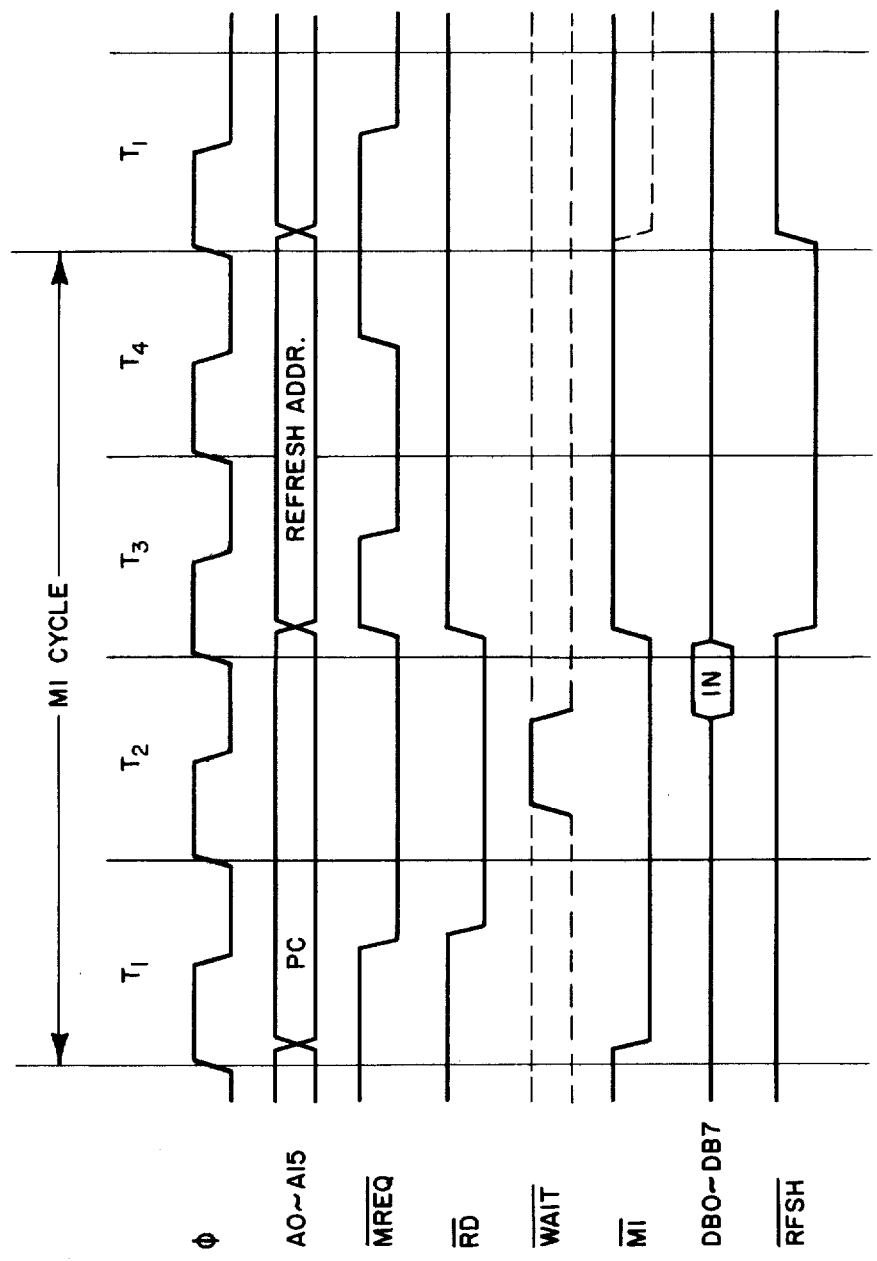
FIG. 6 is a timing diagram of one particular memory cycle of a CPU according to one embodiment of the present invention.

FIG. 6 shows the timing during an MI cycle (OP code fetch). Notice that the PC is placed on the address bus immediately at the start of the cycle (this is done to minimize memory access time requirements). One half clock time later the $\overline{MREQ}$ signal goes active. At this time the address to the memory has had time to stabilize so that the falling edge of $\overline{MREQ}$ can be used directly as a chip enable clock to dynamic memories. The $\overline{RD}$ line also goes active to indicate that the memory read data should be enabled onto the CPU data bus. The CPU samples the data from the memory on the data bus with the rising edge of the clock of state T3 and this same edge is used by the CPU to turn off the $\overline{RD}$ and $\overline{MRQ}$ signals. Thus the data has already been sampled by the CPU before the RD signal becomes inactive. Clock state T3 and T4 of a fetch cycle are used to refresh dynamic memories. (The CPU uses this time to decode and execute the fetched instruction so that other operation could be performed at this time). During T3 and T4 the lower 7 bits of the address bus contain a memory refresh address and the $\overline{RFSH}$ signal becomes active to indicate that a refresh read of all dynamic memories should be accomplished. Notice that a $\overline{RD}$ signal is not generated during refresh time to prevent data from different memory segments from being gated onto the data bus. The $\overline{MREQ}$ signal during refresh time should be used to perform a refresh read of all memory elements. The refresh signal can not be used by itself since the refresh address is only guaranteed to be stable during $\overline{MREQ}$ time.

MEMORY SPEED CONTROL

Figure 7A:
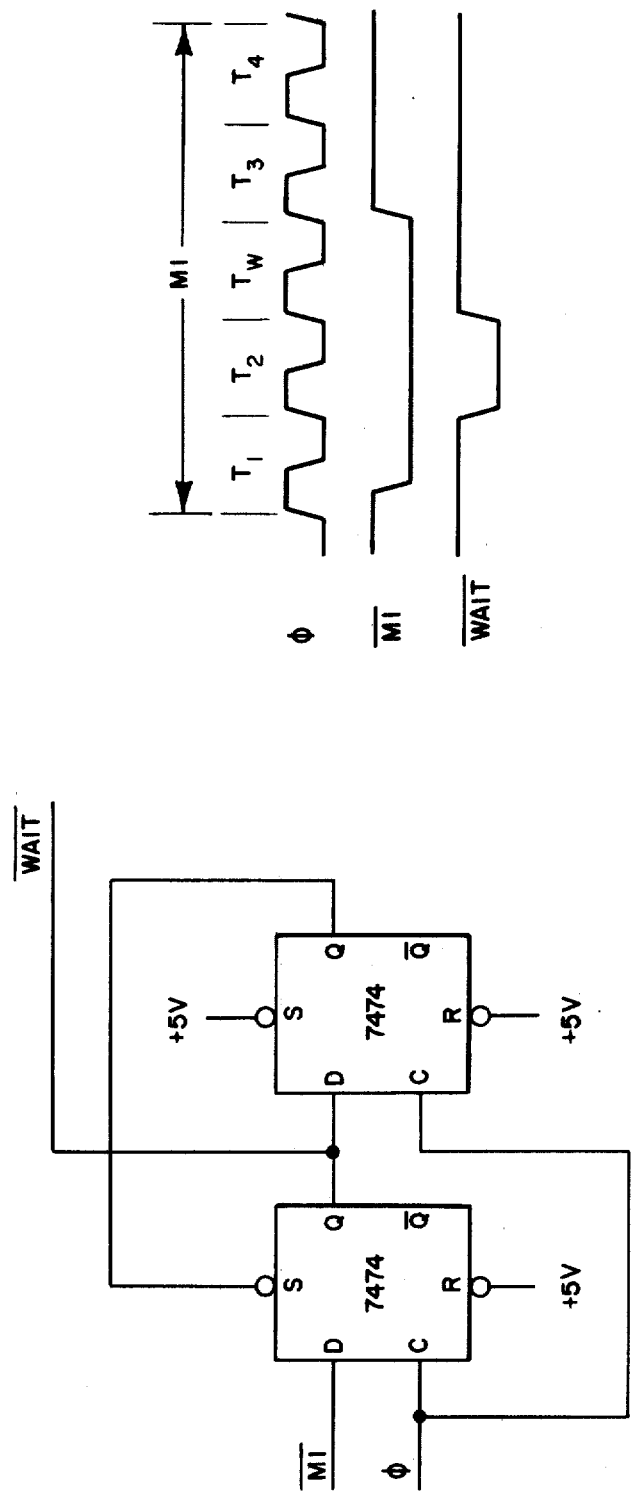
FIG. 7A is a block logic diagram and timing diagram showing an approach for adding a wait state to a particular memory cycle of a CPU according to one embodiment of the invention.
Figure 7B:
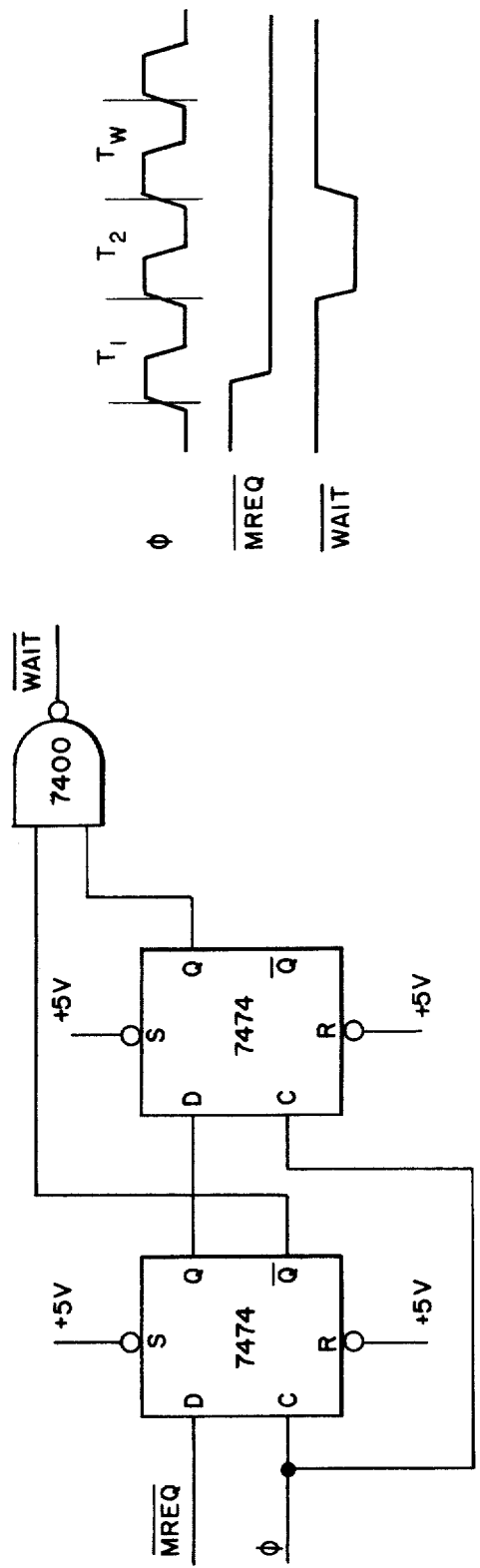
FIG. 7B is a block logic diagram and timing diagram showing an approach for adding a wait state to any memory cycle of a CPU according to an embodiment of the invention.

For many applications, it may be desirable to use slow memories to reduce costs. The $\overline{WAIT}$ line on the CPU allows the Z-80 to operate with any speed memory. By referring back to section 4 you will notice that the memory access time requirements are most severe during the MI cycle instruction fetch. All other memory accesses have an additional one half of a clock cycle to be completed. For this reason it may be desirable in some applications to add one wait state to the MI cycle so that slower memories can be used. FIG. 7A is an example of a simple circuit that will accomplish this task. This circuit can be changed to add a single wait state to any memory access as shown in FIG. 7B.

Figure 8:
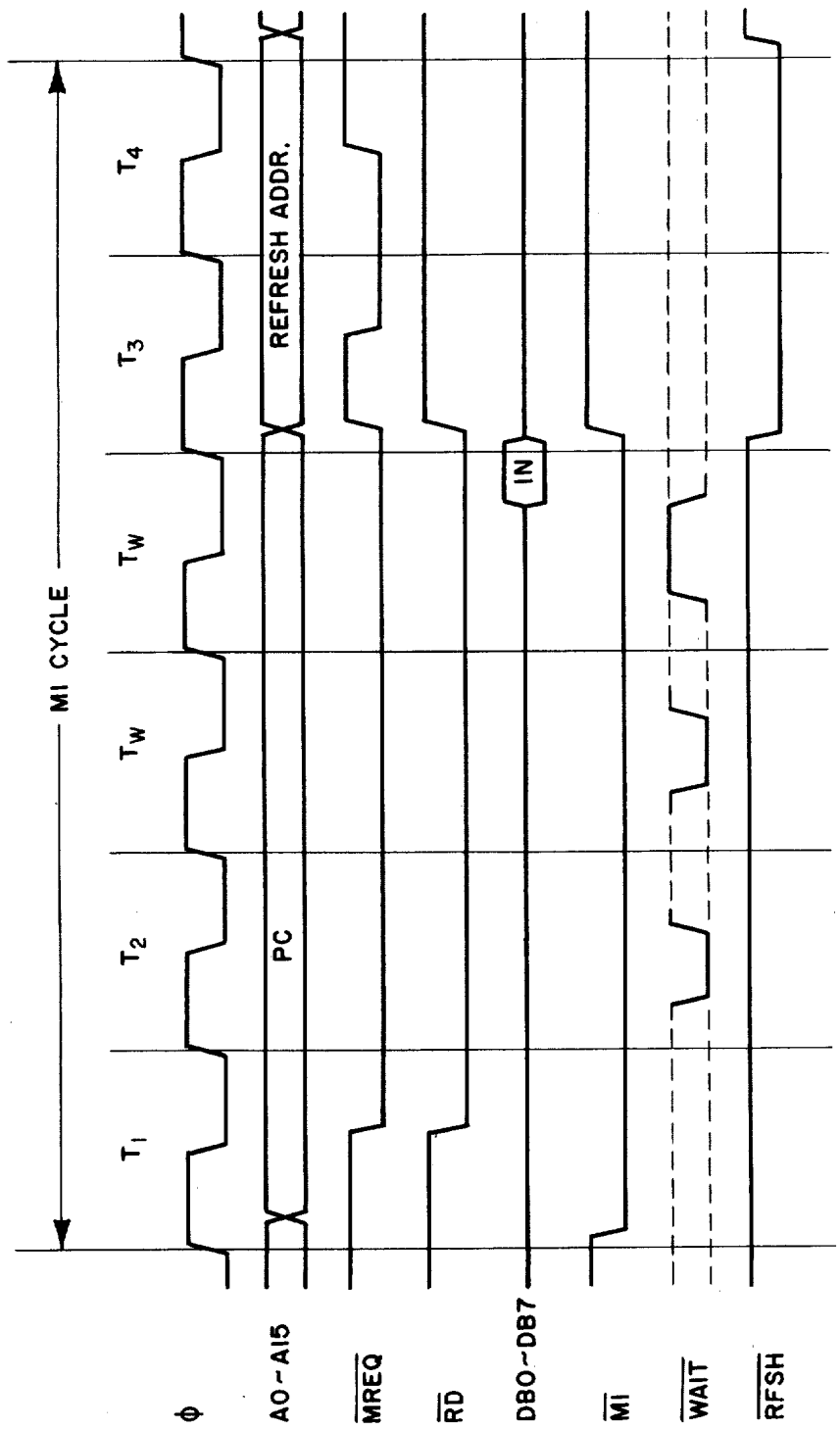
FIG. 8 is a timing diagram similar to that of FIG. 6 but showing the addition of wait states.

FIG. 8 illustrates how the fetch cycle is delayed if the memory activates the $\overline{WAIT}$ line. During T2 and every subsequent Tw, the CPU samples the $\overline{WAIT}$ line with the falling edge of $\phi$. If the $\overline{WAIT}$ line is active at this time, another wait state will be entered. Using the technique the read cycle can be lengthened to match the access time of any type of memory device.

INTERFACING DYNAMIC MEMORIES

This section is intended only to serve as a brief introduction to interfacing dynamic memories. Each individual dynamic RAM has varying specifications that will require minor modifications to the description given here and no attempt will be made in this document to give details for any particular RAM. Separate application notes showing how the Z80-CPU can be interfaced to most popular dynamic RAM's are available from Zilog.

Figure 9:
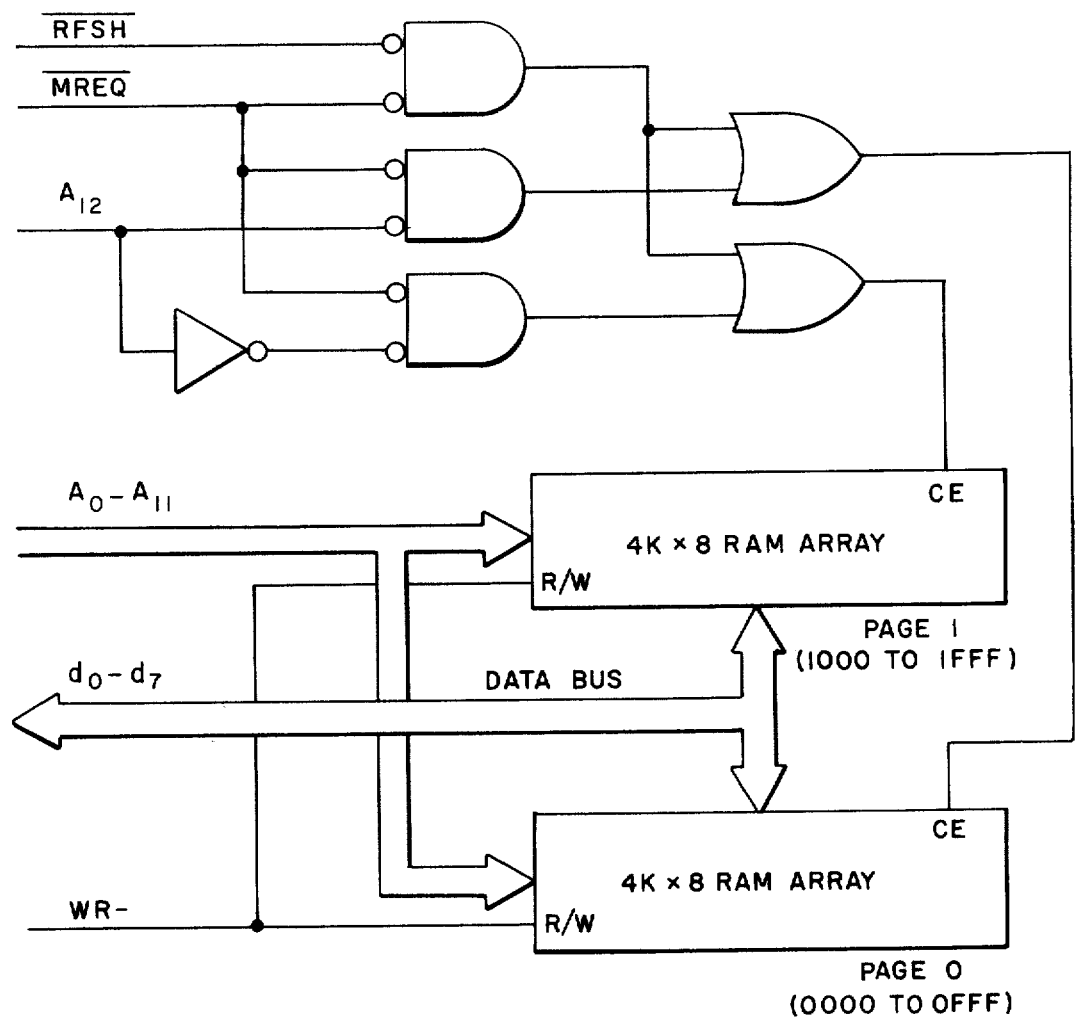
FIG. 9 is a block diagram showing the interface of a CPU with dynamic random access memories according to an embodiment of the instant invention.

FIG. 9 illustrates the logic necessary to interface 8K bytes of dynamic RAM using 18 pin 4K dynamic memories. This figure assumes that the RAM's are the only memory in the system so that $A_{12}$ is used to select between the two pages of memory. During refresh time, all memories in the system must be read. The CPU provides the proper refresh address on lines $A_0$ through $A_6$. To add additional memory to the system it is necessary to only replace the two gates that operate on $A_{12}$ with a decoder that operates on all required address bits. For larger systems, buffering for the address and data bus is also generally required.

FIG. 9A shows the CPU logic for generating the RFSH and $\overline{MREQ}$ signals used by FIG. 9.

Prior art techniques for refreshing dynamic memories are well-known, as are the signal requirements required for refreshing such memories.

Figure 10:
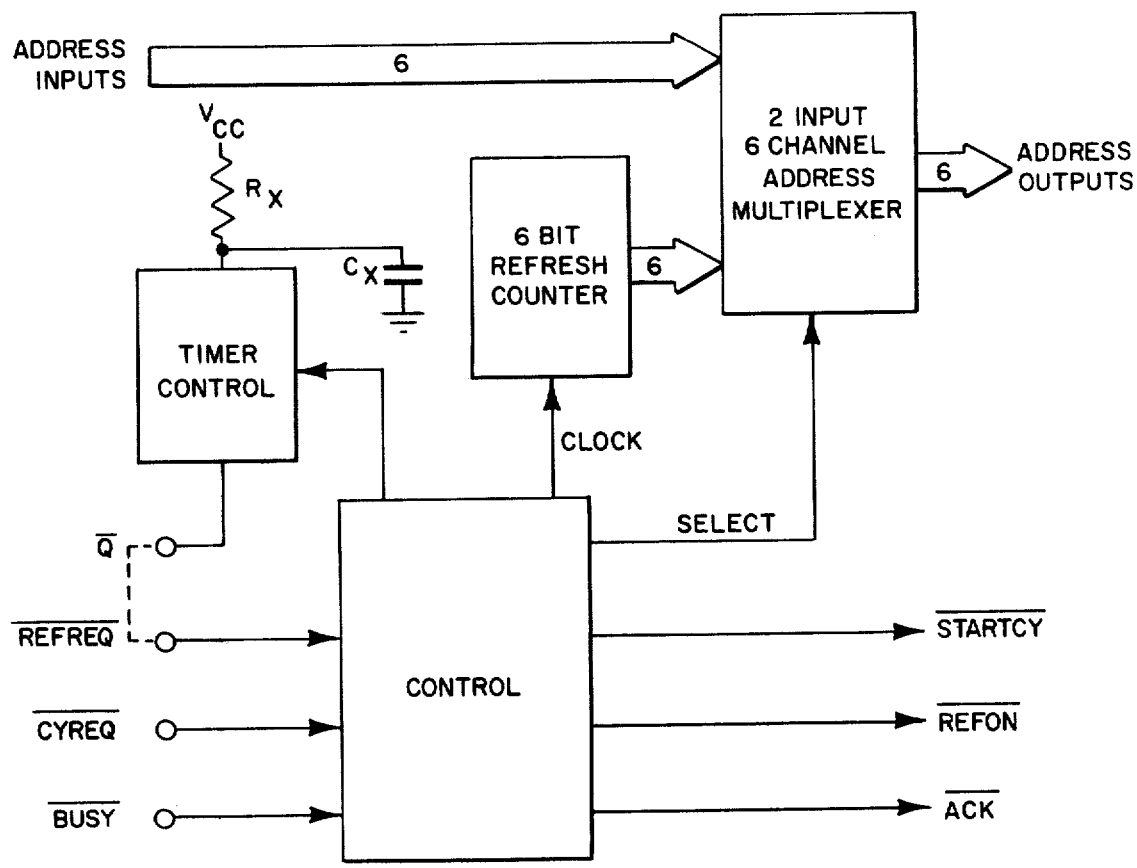
FIG. 10 is a block diagram of a prior art memory refresh controller.

One such prior art refresh controller (the Intel 3222) which operates outside of the CPU is shown in FIG. 10.

The Intel 3222 is a refresh controller for dynamic RAMs requiring refresh of up to 6 low order ($A_0$-$A_5$) input addresses, (e.g. for a device organized as 64 rows by 64 columns). In normal operation, the device serves as an address multiplexer that outputs addresses from either a refresh counter or a system address bus. Although the part was specifically designed for use with the Intel ® 2107B, it will work with any dynamic RAM requiring refresh of up to 64 rows.

The timer control is an oscillator whose period can be set by an externally connected RC network, such that the refresh period can match the memory system that is being controlled. The period of the oscillator is given by the formula:

$$\frac{T_{REF}}{r} = .63 R_X C_X \quad (1)$$

where $T_{REF}$ is the RAM refresh period in ms.

r is the number of RAM rows.

$R_X$ is the external resistor in K$\Omega$.

$C_X$ is the external resistor in $\mu$F.

For example, in the 16 K×18 system described in Section 2, the refresh period for the 2107B is 2.0 ms and there are 64 rows to be refreshed so:

$T_{REF} = 2.0$ $r = 64$ or, from equation 1

$$R_X C_X = \frac{2.0}{64 \times .63} = .0496; \text{ or } R_X = 5.0K\Omega$$
$$C_X = .01 \mu F$$

The accuracy of this timer is guaranteed to be ±6% from device to device, and ±2% from cycle to cycle for a given device.

The control portion of the device, shown below in FIG. 10 contains all of the I/O control elements of the device. These include:

1. The Refresh Request flip-flop, which is set by the timer, will be set up and remain set until the request, for refresh is removed.
2. The priority flip-flop which is the decision making element of the 3222. Whenever either of the cycle request inputs $\overline{\text{REFREQ}}$ or $\overline{\text{CYREQ}}$ go true, the other is locked out until the cycle is finished, thus preventing simultaneous cycle requests.
3. The Execute Refresh flip-flop, which holds the refresh state of the 3222 and is enabled by the $\overline{\text{BUSY}}$ signal.

The 6-bit refresh counter holds the address of the next row to be refreshed and is advanced by the rising edge of $\overline{\text{BUSY}}$ following a refresh cycle. This portion also contains a refresh count flip-flop which prevents false counting of the refresh counter during priority indecision. A delay element is added to further prevent priority glitching from falsely advancing the counter. If the device is in the refresh state the flip-flop is cleared; when $\overline{\text{BUSY}}$ goes true, it is toggled and advances the refresh counter.

The Address Multiplexer presents the low order system address inputs to the RAM whenever the memory is not involved in a refresh cycle. It also presents the counter outputs as the six low order addresses during a refresh cycle.

Integrated circuits have become increasingly complex over the past several years and many improved and up-dated microprocessors have been marketed. However, the architecture of the internal data bus of the microprocessor have heretofore remained relatively unimproved.

FIGS. 1 and 3 show a microprocessor system having a CPU interfacing with an external memory and peripheral devices, directly or indirectly through T²L. The CPU is the heart of the system: its function is to obtain instructions from the memory and perform the desired operation.

At the beginning of each memory cycle, for example, the contents of the program counter is sent to the external memory through the address bus and at the same time the program counter is incremented to update, internally. Next, the addressed memory sends back the instruction to the CPU through the data bus, it is stored in the instruction register and the desired function is executed. For example, the instruction

A+B→A means add B and A, then store the result in A (the accumulator).

Dynamic type random access memories are commonly used by microprocessor system designers. The CPU of the present invention incorporates a memory refresh counter, as explained above. Also, in order to improve total software times, the present CPU includes two accumulators and associated flag registers such as carry flip-flop, zero detection flip-flop, parity check flip-flop, etc.

These addition functions would tend to require more complex CPU logic, larger LSI chip size for the CPU and the loss of CPU speed if prior art internal data bus architecture were used.

In accordance with the present invention, a novel CPU internal data bus architecture is used to overcome the aforementioned problems.

A typical CPU contains the following functional blocks (or digital devices):
 program counter, memory refresh counter
 address bus associated with the incrementor and latches which can store the address information
 general purpose data registers
 accumulators and flags register
 arithmetic unit
 data input/output register
 instruction register The internal bus architecture of the present invention can better be appreciated in view of the various prior art internal bus architectures shown in FIGS. 11-14. FIG. 15 is one exemplary form of the bus architecture of the present invention and FIG. 16 compares operating times for exemplary operations in the architectures of FIGS. 11-15.

Figure 11:
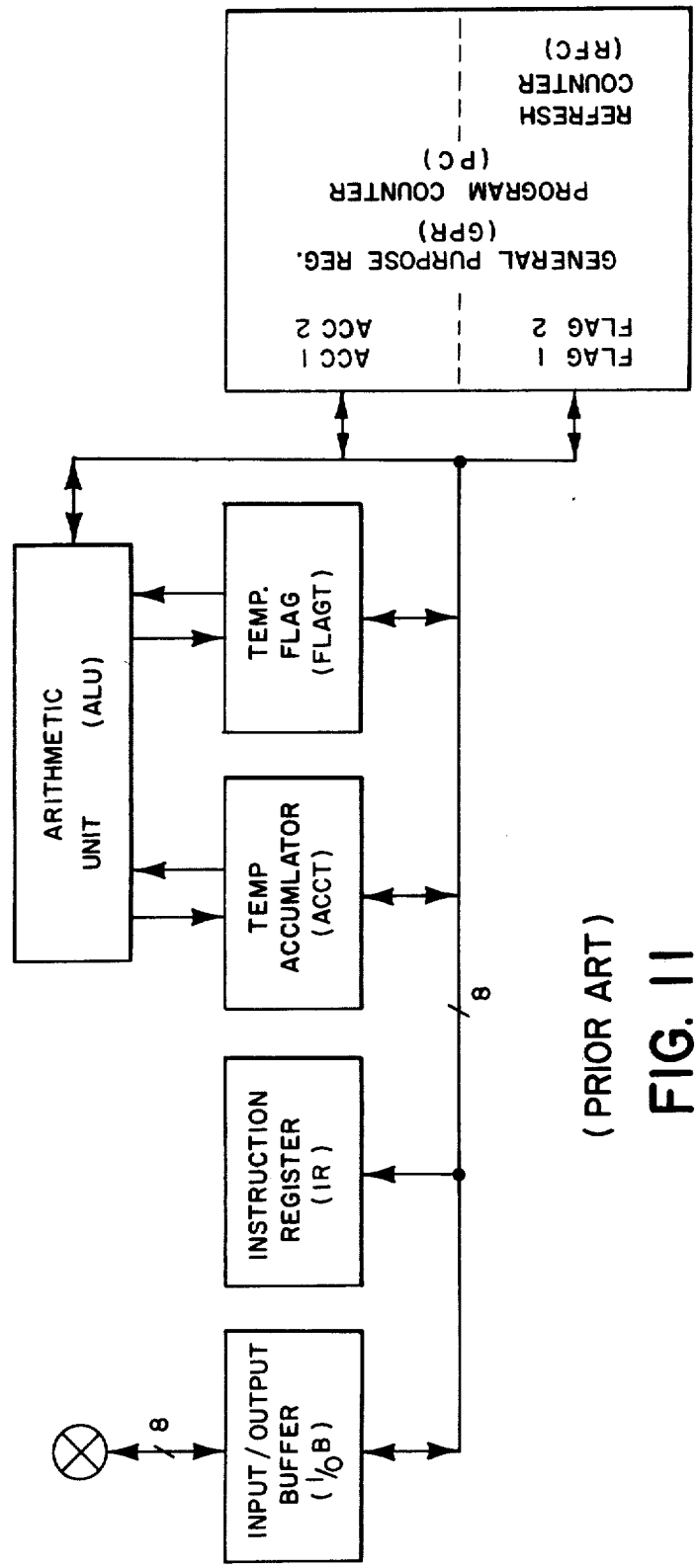
FIGS. 11-14 are block diagrams of prior art CPU bus architectures.

FIG. 11 has a single time multiplexing bidirectional bus carrying both data and address information. Only the single bus communicates with the external world. Its advantage is to reduce LSI chip pin count and minimize LSI circuit area, however, the total instruction speed is so long as to be not acceptable and is not shown in FIG. 16.

Figure 12:
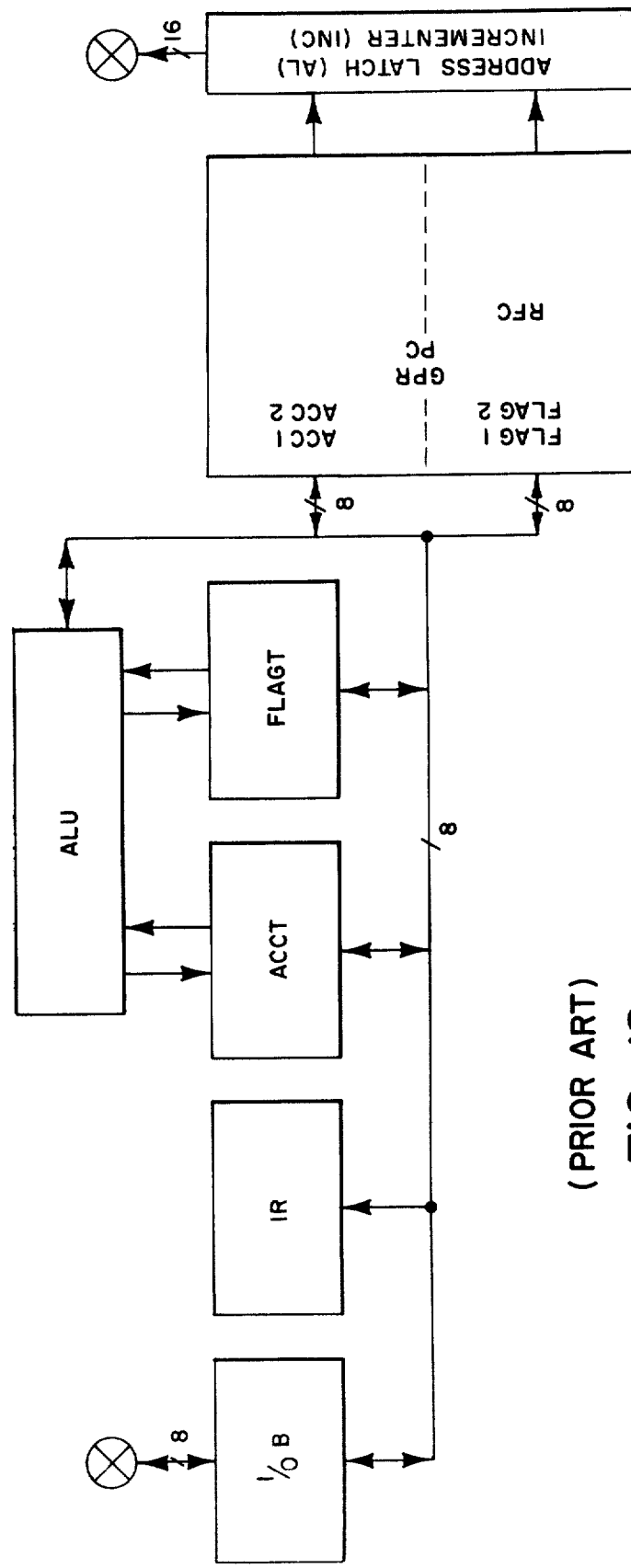

The architecture of FIG. 12 adds an address bus, however, as shown in FIG. 16 the total instruction speed is still slow.

Figure 13:
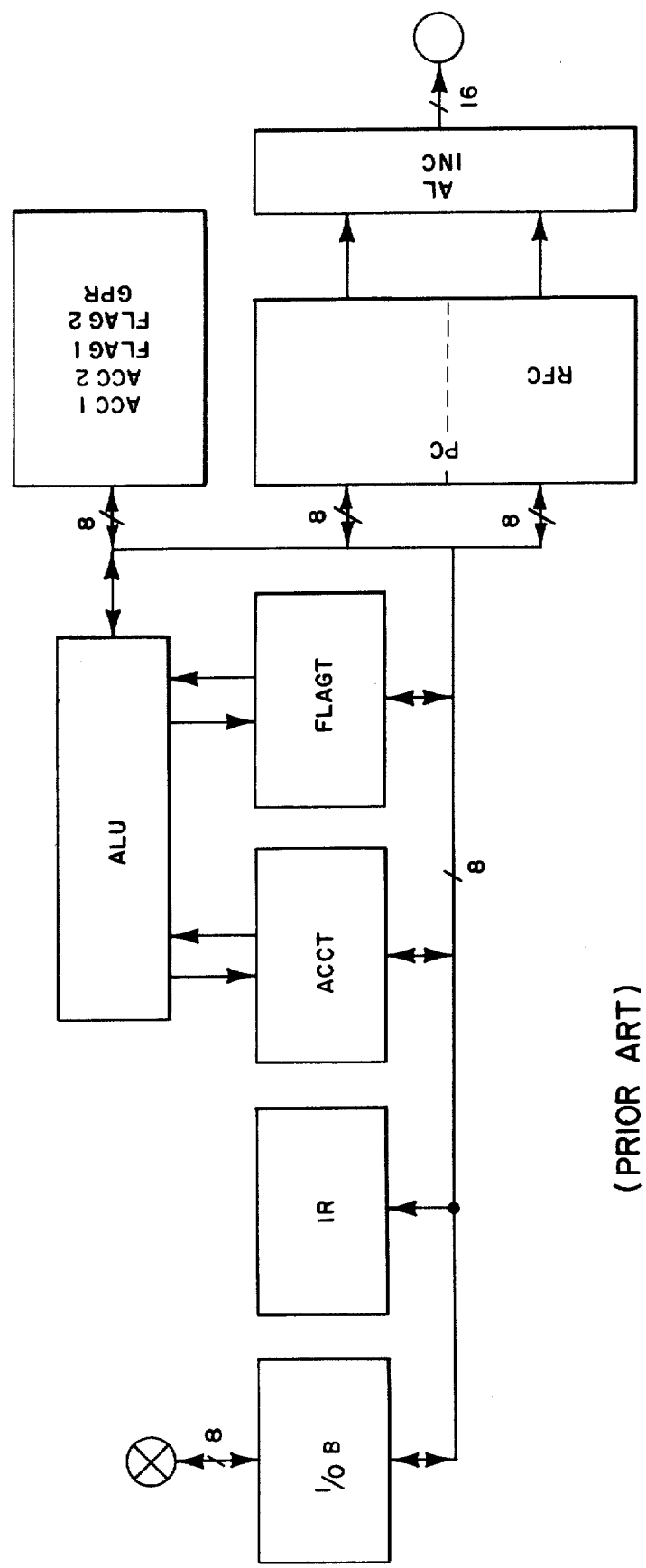

In FIG. 13, the general purpose registers and accumulators are separated from the program counter and memory refresh counter. Nearly 40% of the operating time is saved compared to the architecture of FIG. 12, as shown in FIG. 16. However, the approach has drawbacks: the read/write buffer for the new internal memory must be duplicated and considerable time is required to transfer the data from the general purpose registers to the address bus.

Figure 14:
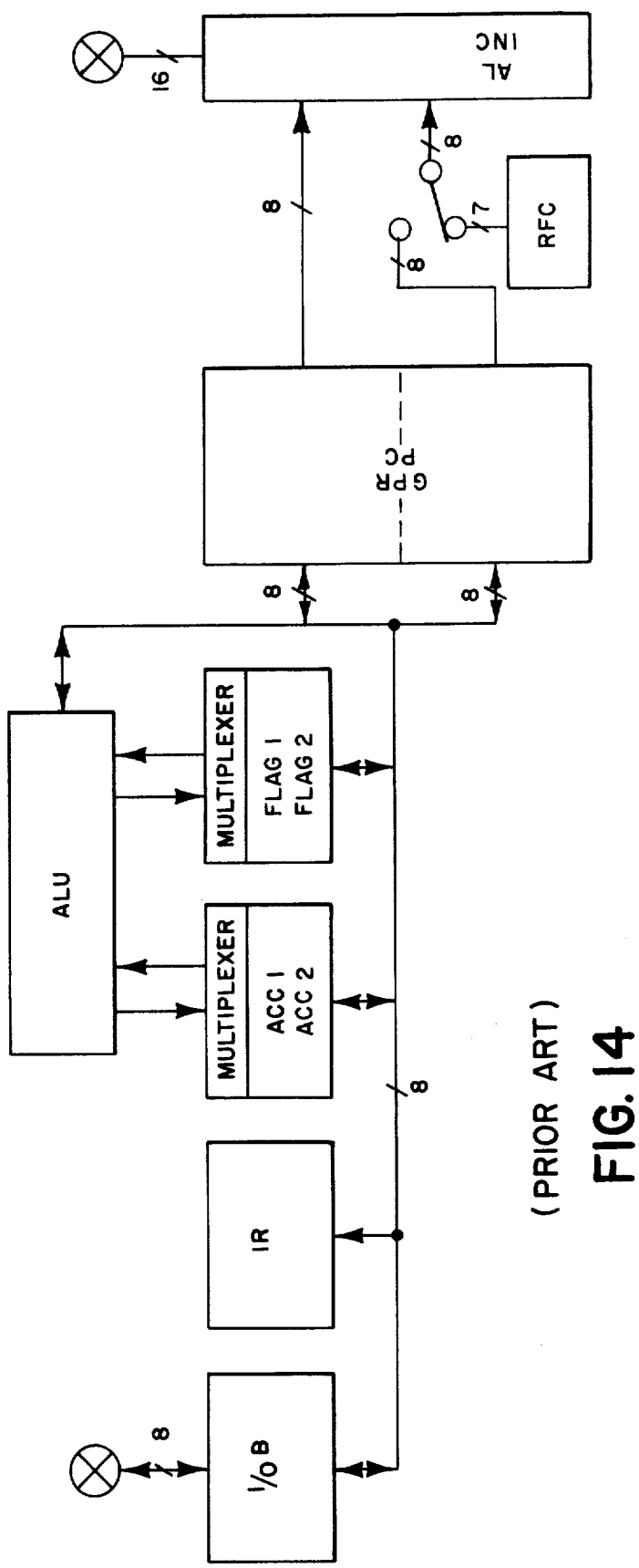
Figure 15:
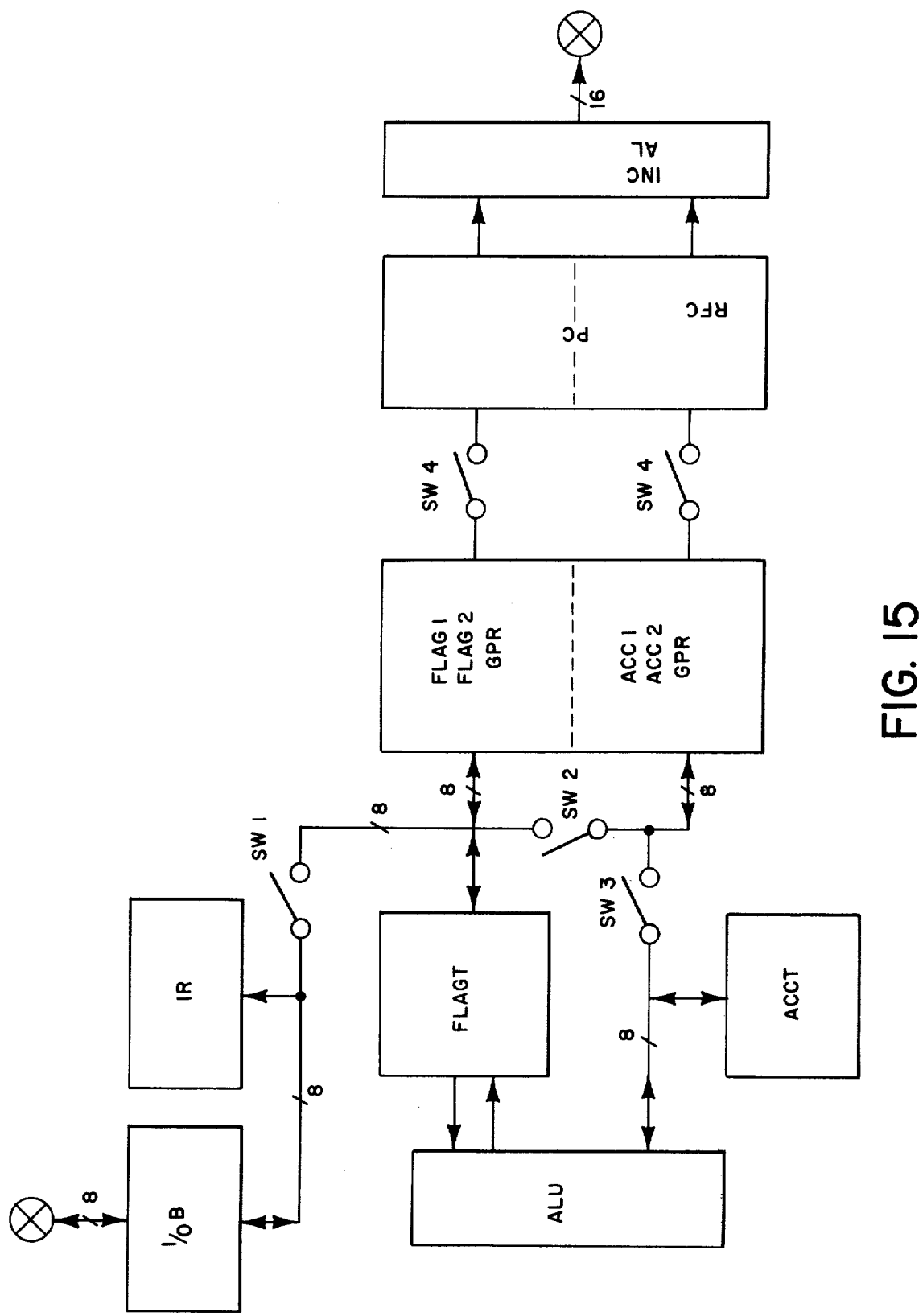
FIG. 15 is a block diagram of a CPU bus architecture according to one embodiment of the invention.

In FIG. 14, the accumulators, flags and memory refresh counter are separated from the internal memory (which includes the program counter and the general purpose registers). The operation time (FIG. 16) is reduced 60% compared to the architecture of FIG. 12, however, it requires relatively large area to implement the accumulators, flags, refresh counter and multiplexers.

It will be apparent that the architecture of FIG. 12 provides reasonable chip size, although with unsatisfactory operating time and that the architecture of FIG. 14 provide acceptable operation time but at the expense of chip size.

The internal bus structure of the present invention minimizes chip circuit area while achieving satisfactory operation time, as shown in FIG. 16.

One example of the present invention is shown in FIG. 15. An organization similar to that of FIG. 12 is used, however, a plurality of switches in the internal data bus divides the several functional blocks into groups depending on which of the switches are opened. In each group, two or more blocks can communicate with each other through portions of the internal bus. At times when communications between two or more groups are required, the switches, which sit between two groups, will be turned on. As a result, each group can perform the desired function at the same time, independently and whenever it is required, any groups can be connected to each other through the same internal bus by turning on the switches. This architectural approach provides great flexibility to the CPU without increasing the ship size and operation time. MOS devices may be used to implement the switches.

Figure 17:
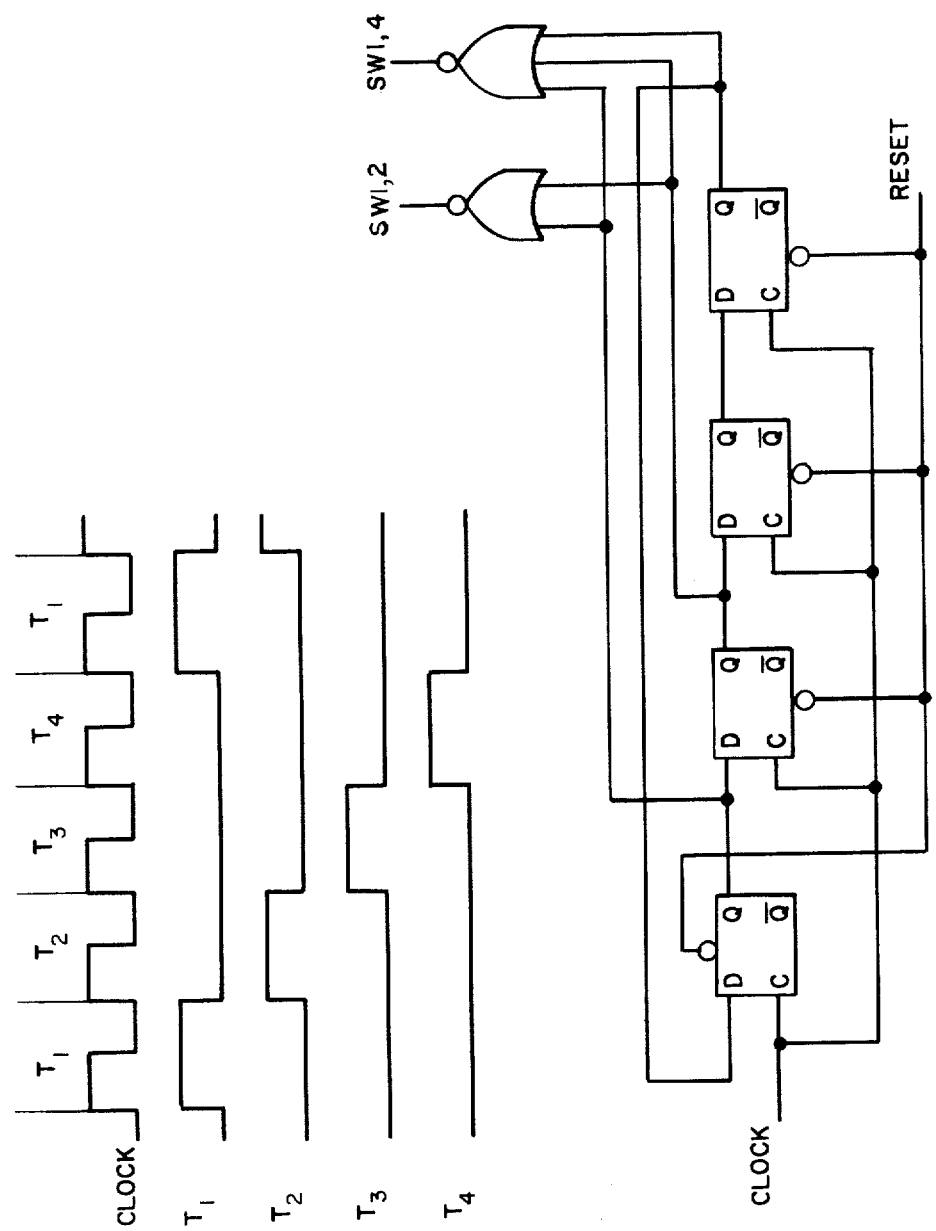
FIG. 17 is a block diagram and timing diagram showing an exemplary switching control for the switches of FIG. 15.

FIG. 17A shows an exemplary timing diagram for controlling the four switches of FIG. 15. FIG. 17B shows an exemplary logic circuit suitable for controlling the switches in accordance with the timing diagram.

Figure 18:
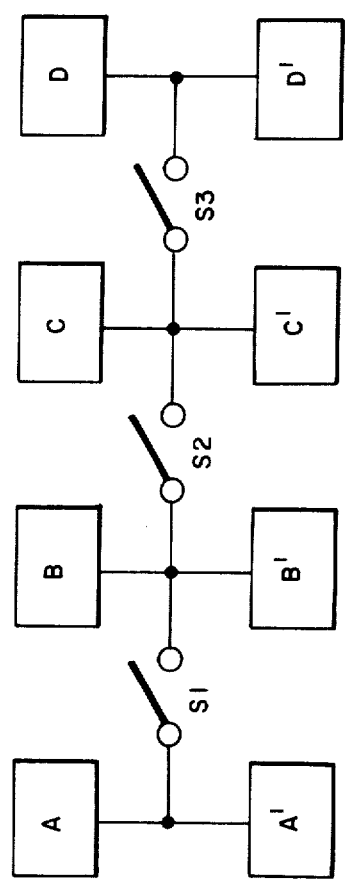
FIG. 18 is a block diagram showing one generalized embodiment of the bus architecture of the present invention.

A more general case of the present invention is shown in FIG. 18 which shows four pairs of functional blocks or digital devices A-A', B-B', C-C' and D-D', all connected on a common bus having three switches S1, S2 and S3.

In establishing an architecture within an entity, such as an LSI chip, the most frequent machine communication pattern is determined and the communication patterns between functional blocks is observed. Blocks capable of communicating at the same time most frequently are arranged in pairs such as A-A', B-B', etc. The next most common communication paths are arranged in adjacent pairs, such A and B'. The next most common paths are arranged one pair removed, as A and C' or B and D, for example. The least frequent communication paths between blocks are disposed farthest apart on the bus system, such as A-D', for example.

The switches are accordingly activated to shorten the operation time. Thus if A and A' can communicate while B and B' communicate then S1 is opened, and so forth. In the example of FIG. 18 there are $3^2$ or 8 different switching states, permitting substantial flexibility in bus communication.

Although the present invention has been described in connection with a specific SLI CPU and associated microprocessor systems, it will be understood by those of ordinary skill in the art that the invention is applicable to other digital processing apparatus. The scope of the invention is therefore limited only by the appended claims.

We claim:

1. A digital central processing unit, on a microcomputer chip comprising:

a program counter, a memory refresh counter, address bus terminals, data bus terminals, means responsive to a clock signal for connecting the value of said program counter to said address bus terminals in a first period of a repetitive machine operation fetch cycle, whereby controlling program operation codes can be obtained at the data bus terminals from a memory connected to said address bus and data bus terminals, means responsive to an operation code received from said data bus terminals during said first period for carrying out during the second period of each such machine cycle the operations specified by such code, means responsive to said clock signal for connecting the value of said memory refresh counter to said address bus terminals in a second period of time of said fetch cycle, thereby to address according to the value of said memory refresh counter, a portion of any memory connected to the address bus terminals, said second period of time following immediately said first period, and means for incrementing each of said program and memory refresh counters before the next succeeding of said machine operation code fetch cycles, whereby an addressed protion of any memory connected to said address bus terminals is refreshed during the second period of each such machine cycle when the central processing unit otherwise does not use the address but terminals, the refreshing of the entire memory occurring after a plurality of such machine cycles occurs, all without slowing down the processing unit.

2. A digital processor system, comprising:

means for generating clock signals, dynamic random access memory means including address and data terminals, said memory being of the type that requires periodic refreshing, central microprocessor unit means receiving said clock signals for generating timing cycles, said central microprocessor unit means including address and data terminals, address bus means for connecting said central microprocessor unit means address terminals to said memory means address terminals, data bus means for connecting said central microprocessor unit data terminals to said memory means data terminals, said central microprocessor timing cycles including time periods in which an instruction code is received by said central microprocessor via said data bus means from said memory means in response to an address applied to said memory means via said address bus means by said central microprocessor means, said central microprocessor unit processing a received instruction code in time periods immediately subsequent to the receipt of an instruction code, and said address refresh signals being generated during said time periods in which said central microprocessor unit is processing a received instruction code, whereby memory refresh is accomplished while the central processor does not need use of the address bus, thereby accomplishing memory refresh without interrupting operation of the central microprocessor.

3. The combination of claim 2 wherein said central processing unit is a digital microprocessor system central processing unit contained on a single large scale integration circuit chip.

4. In a digital system having a central microprocessing unit (CPU) and refreshable memory connected to a common address bus, wherein controlling program instruction codes are stored in said memory for access by said CPU, a process of accessing said program codes by said CPU and maintaining said memory, comprising repetitively performing the steps of:

placing on said address bus from said CPU an address of a particular location in memory where a desired instruction code is located, reading that code into the CPU, executing the instruction carried by the code in the CPU, and simultaneously with the execution step, addressing from the CPU through said address bus a portion of said memory to be refreshed and enabling said memory, a different memory portion from the last being addressed during each of sequential executions of the process, whereby the memory is periodically refreshed when the CPU otherwise does not need to use the address bus, thus accomplishing memory refresh without having to slow down the CPU.

5. In a digital system having a central microprocessing unit (CPU) and a dynamic memory connected to common address and data buses, said CPU including a repetitive machine cycle as part of its operation wherein an instruction code location memory address is placed on the address bus in a first increment of time and the instruction code is received by the CPU on the data bus in a second increment of time, followed by a third increment of time in which the CPU executes the received instruction, a method of refreshing said memory, comprising the steps of placing on the address bus during said third increment of time the address of a segment of memory locations and enabling the memory, thereby to refresh the addressed segment of the memory, these steps being repeated in a similar manner in subsequent machine cycles with a different segment of memory locations being addressed each time until the entire memory has been refreshed, at which time the process is repeated, whereby the entire memory is periodically refreshed without having to interrupt the CPU operation for that purpose.

* * * * *